United States Patent [19]

Le Francois

[11] 4,200,805
[45] Apr. 29, 1980

[54] MULTICATHODE THERMOCHEMICAL PROCESSING OVEN

[76] Inventor: Philippe Le Francois, Place Charles Andrieu, Neuilly-en-Thelle, France

[21] Appl. No.: 888,536

[22] Filed: Mar. 21, 1978

[30] Foreign Application Priority Data

Mar. 23, 1977 [FR] France .............................. 77 08686
Sep. 14, 1977 [FR] France .............................. 77 27785

[51] Int. Cl.² ........................ C23C 11/00; C23C 11/14
[52] U.S. Cl. .................................. 250/531; 148/16.6; 204/177; 266/252
[58] Field of Search ....................... 250/531; 148/16.6; 266/252; 204/177

[56] References Cited

U.S. PATENT DOCUMENTS

| | | | |
|---|---|---|---|
| 2,955,998 | 10/1960 | Berghaus et al. ................. | 204/177 |
| 3,616,383 | 10/1971 | Klauseler ....................... | 148/16.6 |
| 4,109,157 | 8/1978 | Tanaka et al. ................... | 250/531 |

FOREIGN PATENT DOCUMENTS

807,345  1/1959  United Kingdom ..................... 250/531

*Primary Examiner*—Brooks H. Hunt
*Assistant Examiner*—Deborah L. Kyle
*Attorney, Agent, or Firm*—J. Harold Nissen

[57] ABSTRACT

A multicathode thermochemical processing oven for the treatment of articles or metals such as steel or steel alloys by subjection thereof to ionic bombardment. The oven structure includes at least one anode and a plurality of cathodes which form individual anode-cathode couples positioned within an air-tight enclosure containing a processing gas for supplying ions. Each of the cathodes is adapted to carry an individual article and subject the article to a particular type of processing depending upon which cathode carries the part. Each of the anode-cathode couples are connected across a power supply, and each of the cathodes are connected through their own individual switching and coupling device for independently coupling to the power source and independent control to supply different types of energy to its respective cathode as well as control the conduction thereof. A computer memory device is associated with each of the anode-cathode couples to control the processing imparted to the article carried by the individual cathode. Also, the oven is provided with an inlet chamber to provide for pre-heating or passivation or both, and an outlet chamber to provide for cooling or quenching or both.

22 Claims, 4 Drawing Figures

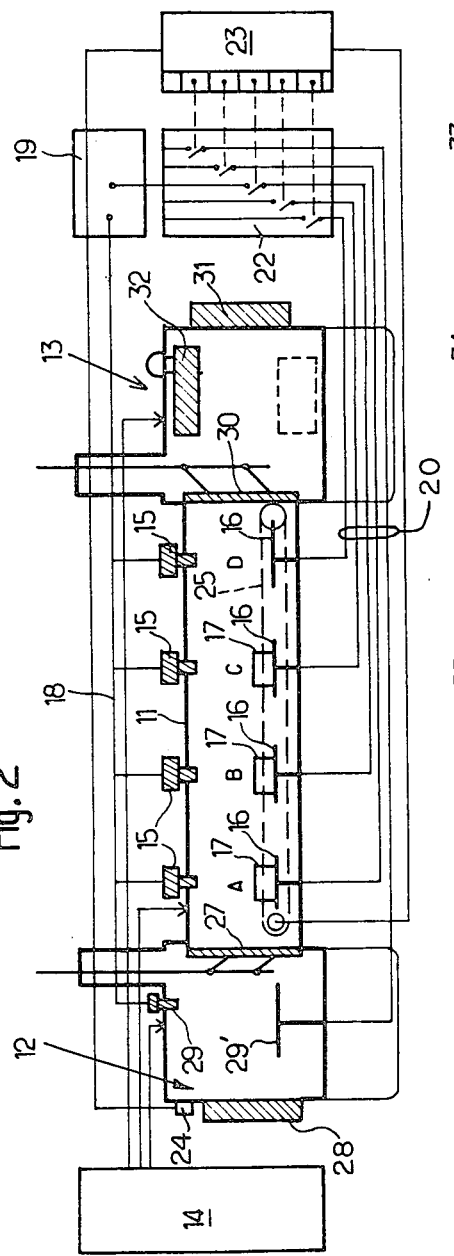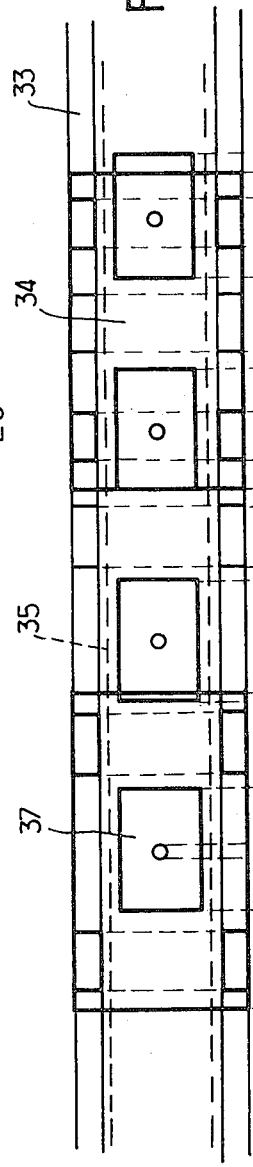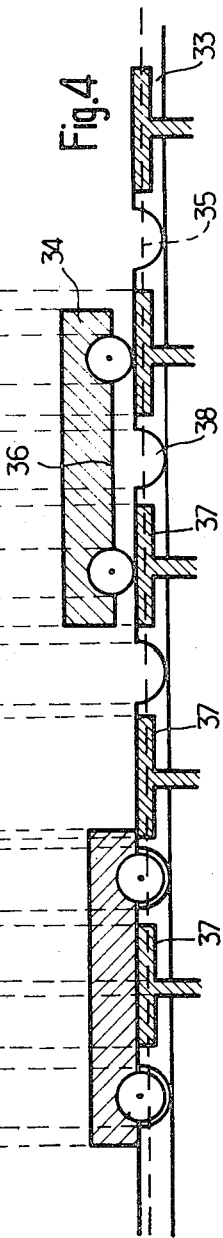

MULTICATHODE THERMOCHEMICAL PROCESSING OVEN

CROSS REFERENCE TO RELATED APPLICATION

This invention is related to application Ser. No. 875,762, filed on Feb. 7, 1978 entitled: Thermochemical Treatment System and Process, in the name of Philippe Le Francois, and assigned to the assignee of this application. The disclosure of the aforesaid application which is based on French Patent application Ser. No. 77 03501, filed in France on Feb. 8, 1977, is incorporated by reference into this application.

BACKGROUND OF THE INVENTION

1. Field of the Invention

This invention relates to an oven for the thermochemical treatment of metals such as, for example, steel or steel alloys. The thermochemical treatment is effected by ionic bombardment.

2. Description of the Prior Art

In general, the ovens usually employed for this purpose are designed to bring the gas used in the treatment process to a very low pressure, for example, a pressure of several mm Hg, and maintain the gas at that pressure. These ovens, in addition, include an anode and a cathode which acts as a support for the parts to be treated. The anode and cathode electrodes are connected across a high voltage direct current power supply circuit.

These ovens are usually operated in two different types of modes.

A first type or mode of operation consists in setting up a difference in potential between the anode and cathode such that, after a transition period, operation of the oven will be maintained on part of the voltage/intensity curve which may give rise to an electric discharge in the gas contained in the oven, close to the arcing regime. This part of the curve of operation is generally known as the "abnormal discharge zone". The curve mentioned heretofore is disclosed in the aforesaid copending application.

A second type or mode of operation consists in using high voltage current pulses instead of a direct current. The total energy of the high voltage current pulses has a predetermined value calculated so that it will not be possible to reach the zone corresponding to the arcing regime in the aforementioned voltage/intensity discharge curve.

It is clear that, in one instance as in the other, the processing temperature obtained is a function of the geometry of the parts. Consequently, one of the significant difficulties of ionic nitriding lies in the fact that only parts which have a very similar geometry can be readily nitrided simultaneously. However, with the prior art ovens, it has not been possible to treat articles with different geometric configurations in the same oven simultaneously.

Furthermore, a serious problem associated with thermochemical treatment processes which use ionic treatment is the problem relating to arc formation.

It is known, indeed, that mainly in the case of the first type of operation previously mentioned, the risk of accidental arc formation is relatively high because the operating point of the oven is close to the arc formation zone. In spite of the use of a protective system with this type of oven, and in which the protective system operates through arc detectors, the risk of deterioration of the parts is high.

Furthermore, this risk of accidental arc formations is multiplied if several parts having different geometries are treated simultaneously in the same oven. Indeed, it is known that arc formation is, among other things, a function of the geometry of the parts (tip effect, for example, etc. . . ).

It should also be noted that with the conventional ovens, there is a particular operating cycle which is carried out. The operating cycle in an ionic bombardment oven comprises the following sequences:
1. Charging of the oven under an atmosphere with oven open.
2. Production of a vacuum inside the oven.
3. Cleaning and passivation of the parts using a sequence of ionic bombardment with a passivation gas such as hydrogen.
4. Cleanout operation by vacuum drawing.
5. Introduction of a processing gas or gaseous mixture.
6. Actual thermochemical treatment.
7. Cooling under an atmosphere or immersion in an appropriate liquid.
8. Removal of the parts from the oven.

It is clear that during a conventional thermochemical treatment, it is necessary to effect a continuous cleanout inside the oven. Taking into account the technology of the equipment, such continuous cleanout implies a substantial expenditure of energy.

In addition, because these ovens are opened and closed a large number of times, the surrounding air in the premises in which the ovens are located is polluted. Furthermore, the inside of the oven where all the successive operations are carried out may also be the site of gaseous mixing which may lead to explosions. The personnel assigned to these premises is therefore subjected to working conditions which are often difficult and relatively dangerous.

It is therefore the object of the invention to eliminate all these drawbacks.

Another object of the invention to provide for the simultaneous treatment of several parts having different geometrical configurations in one and the same processing oven.

A further object of the invention is to provide for the simultaneous treatment of several parts having different geometries without increasing the risk of arc formation.

SUMMARY OF THE INVENTION

In order to accomplish the foregoing objects, the present invention proposes the use of a plurality of cathodes, and more specifically, a plurality of anode-cathode couples in the oven.

Accordingly, the invention proposes an oven having a structure similar to the conventional ionic bombardment ovens but which comprises, instead of a single cathode, a plurality of cathodes connected in parallel across the oven's general power supply by means of separate circuits which can be provided with a system for detecting intensity increases and arc rupture.

In addition, the invention relates to an improvement in the above-described oven which provides for continuous operation of the oven for a series of parts.

The invention further proposes an ionic bombardment thermochemical processing oven which operates continuously and nevertheless provides for the "custom" treatment of parts having different geometries. In such an oven, the various phases involved in the treatment of parts occur in independent non-materialized spaces. For example, the space wherein the thermochemical treatment phase takes place is isolated from the spaces corresponding to other treatment sequences, and such space is therefore maintained under vacuum or partial pressure and at a relatively constant temperature which leads to a substantial decrease in power consumption. Furthermore, because each processing station is electrically isolated from the others and is under low pressure, pollution and safety problems are easily solved.

In order to obtain these results, in its simplest embodiment, the oven according to the invention comprises a vacuum processing oven structure which includes at least one anode and as noted heretofore several cathodes and means providing for the successive transfer of parts from one of the cathodes to the next cathode. Transfer from one cathode to the next is effected from an inlet chamber to an outlet chamber of the oven.

According to a characteristic of the invention, a preheating or passivation phase or both of the parts is provided. For this purpose, an inlet chamber of the oven can have a vacuum processing oven structure comprising an anode and a cathode for the purpose of effecting ionic bombardment. This vacuum processing oven structure makes it possible to carry out in this chamber of preheating and/or passivation phase of the parts.

Furthermore, an outlet chamber is provided which can include devices suitable for carrying out auxiliary treatments; such devices can include a cooling system and/or a quenching tank.

According to another characteristic of the invention, the direct current as well as the pulse voltage of each of the anode-cathode couples can be adjusted independently from the other anode-cathode couples.

In many situations, it is preferable that the amount of time each part is placed onto a cathode or supported between an anode-cathode couple remains constant. In this type of situation, the maximum time for treatment of the various parts or articles is divided by the number of anode-cathode couples. In such a situation, in order to effect the treatment of parts requiring different processing times, a computing member is provided. This computing member is provided with a memory which is designed to memorize data relative to the treatment of each part, and the computing member monitors the progression of the parts inside the oven and cuts the voltage of the anode-cathode couples to which the part is subjected as soon as the processing time approaches its end.

The nature of the voltage of each of the anode-cathode couples can be of different types.

A first type consists of a continuous voltage having a value such that after a transitory period, operations are maintained on that part of the voltage/intensity curve generally known as the abnormal discharge zone. Such an operation can be suitable, for example, for the first anode-cathode couple or for the anode-cathode couple set out in the inlet, with a view to obtaining a preheating of the part, and eventually a passivation of the part.

A second type of operation consists in using high voltage current pulses instead of a continuous current. However, the total energy of the high voltage current pulses has a predetermined value, and this predetermined value is calculated so that it will not be possible to reach the zone corresponding to the arcing regime in the voltage/intensity discharge curve.

A third type of operation consists in superposing voltage pulses the total energy of which has a predetermined value, at a suitably chosen continuous voltage.

In order that the invention may be more clearly understood and readily carried into effect, it will now be described more fully with reference to the accompanying drawings.

BRIEF DESCRIPTION OF THE DRAWINGS

FIG. 2 is a schematic view partially in section of a continuous thermochemical processing oven according to the invention;

FIG. 3 illustrates a schematic top view of a transfer device which can be used in conjunction with and in the oven shown in FIG. 2; and, FIG. 4 is a schematic longitudinal vertical section of the transfer device of FIG. 3.

DESCRIPTION OF THE PREFERRED EMBODIMENTS

Figure 1:
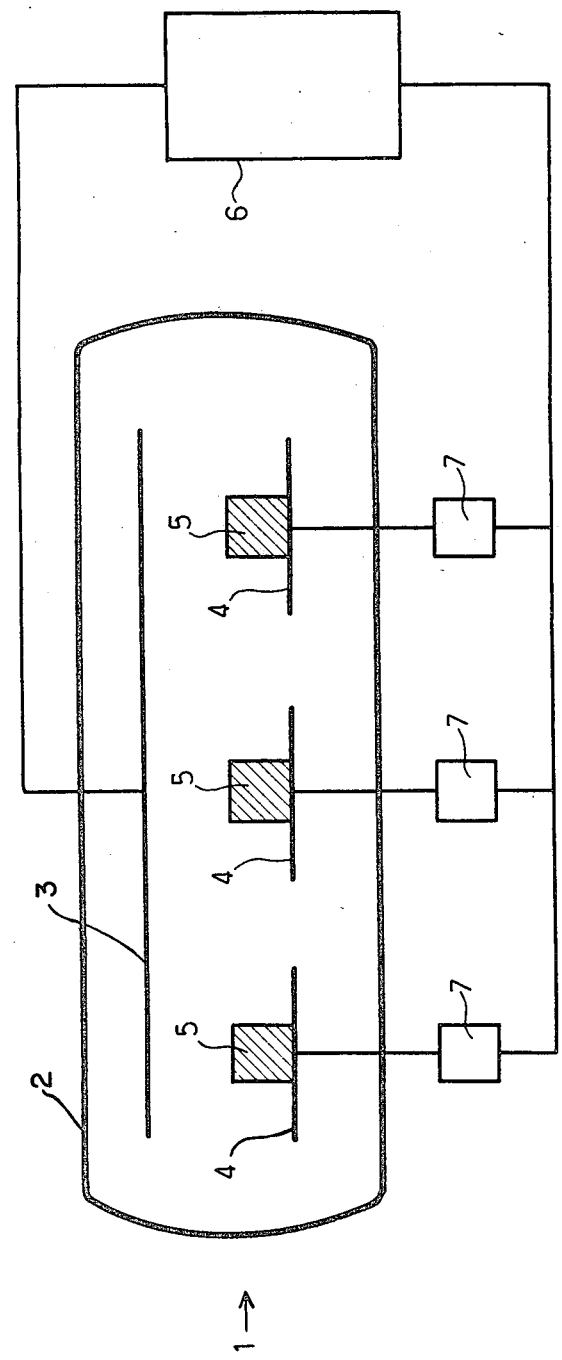
FIG. 1 is a schematic illustration of an ionic bombardment thermal processing oven according to the invention to illustrate the theoretical relationship of the various components and assist in the explanation of the invention.

Referring now more particularly to FIG. 1 which illustrates a reduced atmosphere oven structure 1. The oven structure 1 includes an envelope forming a thermally insulating and air-tight enclosure 2, means to provide a relative vacuum inside the oven with processing gas access conducts and a cooling system. Oven structure 1 also includes within enclosure 2, an anode 3, a plurality of cathodes 4 designed to support parts 5. Anode 3 is shown as a single anode element, but it may be formed from a plurality of anode elements, one for each cathode 4. Anode 3 - cathode 4 forms an anode-cathode couple and is connected across a high voltage, high intensity power supply 6. Anode 3 is directly connected to one terminal of power supply 6, and each cathode 4 is connected in parallel through a separate switching and arc breaking assembly 7 to the other terminal of the power supply 6.

Anode 3 is connected to one terminal of a high voltage high intensity power supply, and each of the cathodes 4 are connected in parallel with each other and to other terminals of the power supply or power source 6. As will be explained further, each of the cathodes are separately controlled and separately fed so that each cathode when combined with the anode forms a separate anode-cathode couple independent from the other anode-cathode couples.

The parts 5 may each have a different geometrical contour from the other, and yet they can all be processed in the same oven structure 1 at the same time. In effect, when the parts or metals, such as the steel or steel alloys are placed onto the respective cathodes, each anode-cathode couple with the part thereon acts as a separate operating unit, separately controlled and separately connected to the power source 6 through its own individual switching and arc breaking assemby 7.

Thus, when the thermal treatment is to be carried out on parts 5, each having a variable geometry, each of these parts 5 is set out on respective cathodes 4 and the actual treatment is then carried out, for example, by selectively interrupting the duration of treatment of the parts as a function of their geometry by means of the switching assembly 7. Some of the other of the different types of treatment can be carried out.

The parts are maintained in the oven as long as the treatment of the part requiring the longest treatment has not been completed.

It is clear that if arcing should begin on one of the parts 5 as a result of its geometry or due to the presence of impurities, the arc detection system 7 which is associated with the particular cathode 4 on which this part rests, will detect this flashover and when the aforesaid arc detection system 7 will cut the circuit of the particular cathode 4. Cutting or elimination of this circuit is then accomplished without interrupting the treatment of the other parts which are placed on the other cathodes.

It should be noted that when the thermochemical treatment is effected by setting up a succession of limited energy and high voltage potential pulses between each cathode 4 and the anode 3, these pulses can be emitted in synchronism on each of the cathodes 4 even though they are supplied from a common power source 6. However, if the geometry of each of the parts is quite different, it is also possible to stagger the emitted pulses for each of the cathodes, and accordingly to adjust the energy of the pulses corresponding to each of the cathodes. In addition, if different treatments are to be effected on each of the parts, it is also possible to vary the time period between each pulse from one cathode to the other. This result can be obtained from a single generator, and a switching system which operates as a frequency divider and which periodically eliminates pulses.

It should be noted, that the oven according to the invention can comprise a power supply having a first phase of operation which makes it possible to provide a continuous voltage calculated so that the operating point of the oven is located in the abnormal discharge zone of the voltage/intensity curve for each of the anode-cathode couples of the oven, but at a point sufficiently distant from the arc formation zone to eliminate as much as it is feasible the possibility of arc formation. And the oven also has a second phase of operation in which a succession of high voltage but limited energy pulses are provided and during each of the pulses, the operating point of the anode-cathode couples is displaced on the voltage/intensity curve up to a limiting point which is sufficiently distant from the arc formation zone so that no arcing can take place.

Referring now to FIG. 2 of the drawings which shows an oven to thermochemically treat metallic parts having a main tubular body 11 with a horizontal axis and opening at its inlet end to an inlet chamber 12 and opening at its outlet end to an outlet chamber 13. While body 11 is shown as tubular, any other compatable geometric shape can be used. The tubular body 11 as well as the two chambers 12 and 13 each have a structure similar to that of the vacuum thermal processing ovens and are associated with a conventional vacuum generating apparatus 14. In order to vary the pressure in either chamber 12 or chamber 13 without changing the pressure inside tubular body 11, the vacuum generating apparatus is provided with a separate control.

In the example shown in FIG. 2, the tubular body 11 comprises, in addition, a series of anodes 15 (shown schematically) distributed along the upper part of body 11, and a series of cathodes 16, provided as plates on which parts 17 are placed in succession. The parts 17 are the steels to be treated.

Anodes 15 are connected with one another by means of a single line or connector 18 joined to one outlet of a high voltage and limited energy pulse generator 19. It should be noted in this respect that it is possible to provide only one anode extending longitudinally from one end to the other of the oven.

The cathodes 16 are joined, through separate circuits 20 to the other outlet of generator 19 and such connection is effected through a switching system 22 which is controlled by a computing member 23. This computing member 23 is mainly designed to individually control the treatment of each of the parts during their progression inside the oven.

A display member 24 which an operator can place at the inlet to the oven is used to indicate and visually display the type of treatment each part is to receive as it moves through the oven. The computing member 23 is responsive to circuits in display member 24 to program the member 23 and thereby the oven to provide for the appropriate treatments to each of the parts. Specifically, computing member 23 includes a memory in which the treatment, the part is to receive from each of the anode-cathode couples, is stored. Therefore, the processing in the oven is directly responsive to the schedule placed onto the display member 24.

Computing member 23 in response to the information stored in its memory can turn off those cathodes on which parts 17 are positioned when the processing time for the individual parts 17 is completed or there are no parts on the cathodes. While four cathodes A, B, C and D are shown, the number can be related to the type of processing and the size of the oven.

Conveyor mechanism 25 is provided to act as a transfer member inside the main body 11 to transfer parts 17 in succession from cathode to cathode. By means of the transfer member shown schematically by the step by step feed chain conveyor 25 or by means of a member of the type pushing at a rate set by computing member 23 (or vice-versa), the parts 17 are moved from one cathode to another so that appropriate processing can take place on each of the cathodes.

In order to make it possible to illustrate the operation of the oven, it will be assumed that the maximum operation of treatment for a particular part is four hours. Consequently, an exposure time of one hour for each of the parts 17 on each of the cathodes 16 will be used. Thus, taking into account the fact that the transfer time is negligible with respect to the exposure period, the frequency of transfer is one transfer per hour.

It will also be assumed for purposes of explanation that three parts 17 and not four parts 17 are to be treated, i.e., parts $P_1$, $P_2$ and $P_3$. Part $P_1$ is subjected to a three hour treatment; part $P_2$ is subjected to a two hour treatment, and part $P_3$ is subjected to a four hour treatment.

During the first hour, part $P_1$ rests on cathode A which is connected to the generator, and cathodes B, C and D which do not support any object are disconnected.

During the second hour, cathodes A and B which are connected to the generator support respectively parts $P_2$ and $P_1$; and, cathodes C and D are disconnected.

During the third hour, cathodes A, B and C are connected and support parts $P_3$, $P_2$ and $P_1$; and, cathode D is disconnected.

During the fourth hour, cathodes B, C and D support parts $P_3$, $P_2$ and $P_1$; and, only cathode B is connected.

During the fifth hour, only parts $P_2$ and $P_3$ remain; and, only cathode C is connected.

During the sixth hour, only part P₃ remains on cathode D which is connected.

When the duration of treatment of one of the parts is not equal to a whole number of hours, for example, 2.5 hours, this particular part will be exposed, as described, on cathodes A and B for one hour each for a total of two hours. On the other hand, when the part is on cathode C, such part will be under voltage or exposed for only 0.5 of an hour. The computing member 23 then intervenes to disconnect this last-mentioned cathode after 0.5 hours. The part then remains for 0.5 of an hour on the disconnected cathode C, and the part is then transferred to cathode D, so that the frequency of transfer is not modified.

Inlet chamber 12 communicates with the main body 11 through a retractable air-tight door 27 and with the outside through a conventional air-tight door 28.

Inlet chamber 12 can also function as a pretreatment area in which the parts are passivated or preheated. Passivation takes place by means of the ionic bombardment with a gas, such as hydrogen which is used as the passivation gas.

Chamber 11 includes an anode 29 and a cathode 29'. The parts which are to be treated are successively placed into chamber 11 to effect the preparatory treatment.

A transfer member, not shown, makes it possible to transfer the parts located in chamber 12 at a rate in step with that of the transfer effected by conveyor 25 located inside body 11 of the oven. This transfer is of course effected only after the cleanout of the chamber 12 and the setting up of a pressure equal to the pressure inside of body 11. Furthermore, actuation of the air-tight door 28 can be controlled by computing member 23 at a frequency corresponding to that of the transfer with a slight phase advance and slight delay on closure.

In a similar manner, the outlet chamber 13 communicates with body 11 through a rectractable air-tight door 30 and communicates with the outside through a conventional air-tight door 31. Outlet chamber 12 includes a cooling device shown schematically by means of block 32 as well as a quenching tank, not shown. Chamber 12 can also additionally include a transfer and handling system appropriate to the treatment which it is desired to obtain; the duration of this treatment is provided so that, in principle, it does not exceed the transfer period inside body 11. In a manner similar to door 28, door 30 can be controlled by the computing member 23.

It should be noted in this respect that in order to obtain an entirely automatic operation of the oven as a whole, computing member 23 can be used to control the depression, and the cleanout and treatment operations which are effected inside the chambers.

Referring to FIGS. 3 and 4, which illustrates in detail the transfer device 25. This transfer device 25 generally includes a conveyor line consisting of two parallel rails 33 on which carriage 34 are set to roll. These carriages 34 are driven in a conventional manner by closed loop chains 35, which mesh at each of their ends with pinions or similar members. Carriages 34 are made of a conductive metal and are designed to receive the parts to be treated.

Carriages 34 include a plane or planar surface 36 which are designed so that they can bear on plate 37. The carriage 35 is provided with conventional wheels which are adapted to roll over plates 37 and to fit within notches 38 provided in the rails 33 between each pair of plates 37.

Plates 37 are set at a height above rails 33 and notches 38 so that when the carriage 34 moves between the two cathodes on rails 33, the space betwen the cathode and the lower face 36 of carriage 34 will be sufficient to avoid all contact.

When the lower face 36 of the carriage is at right angles with the cathode, contact between face 36 and the cathode can be effected through notches 38.

Notches 38 and the height of plates 37 are interrelated to the wheel diameter of carriages 34 to assure contact between the cathode and the lower face 36 of carriage 35.

The notched rail system is effective with the carriages or conveyors 34 to place the carriages 34 into electrical contact with the cathodes when aligned or in registry therewith and to space the carriages from the cathodes when they are not aligned therewith. The wheels and notches 38 are designed so that when the wheels are in the notches, the carriages are in registry and alignment with the cathodes.

On the other hand, when the lower face 36 of the carriage is at right angles with the cathode, the contact between face 36 and plates 37 can be effected having the notches 38 made with an adequate and appropriate depth.

Such a system is provided so as to avoid any hollow cathode phenomenon which might be the source of arc formation.

The invention is of course not limited to the type of contacts previously described, these contacts being obtainable, for example, by means of lateral collectors.

It should be noted that the previously described oven can be obtained by assembling modular components each of which can comprise an anode and a cathode. Such an arrangement leads to better accommodation of the oven to the treatments which it is desired to carry out.

While there has been shown and described what is considered to be the best mode for carrying out the invention and the preferred embodiment thereof, it will be obvious to those skilled in the art that various changes and modifications may be made therein without departing from the scope of the invention.

I claim:

1. A multicathode thermochemical processing oven for the treatment of different types of metal selected from the group consisting of steel and steel alloys, simultaneously and in the same oven by the ionic bombardment thereof, comprising:

an air-tight enclosure containing at least one anode, at least two individually operable cathodes spaced from and operatively associated with said one anode to form at least two separate anode-cathode couples independent from each other without interacting with each other and a processing gas for supplying ions maintained at a very low pressure;

a high voltage power source having a pair of terminals, said anode being connected to one of said terminals, each said anode-cathode couples including separate switching circuits and separate circuits for connection to said high voltage power source; and, an individual and separate switching and arcbreaking assembly for each said cathode, each said assembly connecting its said associated cathode to the other of said terminals, and wherein the metals to be treated can be set out individually on individual ones of said cathodes and treated as a group while imparting different treatments to each of the metals placed onto said cathodes.

2. A thermochemical processing oven according to claim 1, comprising an oven structure including an inlet chamber, an outlet chamber, said cathodes being arranged in succession between said inlet chamber and said outlet chamber, and means successively transferring parts onto each of said cathodes successively from said inlet chamber to said outlet chamber.

3. An oven according to claim 2, wherein said outlet chamber comprises a cooling system.

4. An oven according to claim 2, wherein said outlet chamber comprises a quenching system.

5. An oven according to claim 2, including means to adjust the power applied to each of said anode-cathode couples independently of the other and to permit the application of a continuous voltage to one of said anode-cathode couples and a pulsating voltage to one of said other anode-cathode couples.

6. An oven according to claim 2, including
a separate circuit for each said switching and arc breaking assembly for connection to said power source,
control means including a computer member having a memory stored with information relating the duration of treatment of each of the different types of metals, and
means coupling said assembly in circuit with said computer member and said power source for individually controlling each said cathode to control the treatment of each metal as it passes from one cathode to another as the metal passes through the oven.

7. An oven according to claim 6 wherein said computing member of said control means acts on each said assembly in particular, to switch off those cathodes on which are positioned those metal parts for which the processing time has been exceeded, whatever the position of these steel parts inside the oven and to switch off those cathodes free of any metal parts.

8. An oven structure according to claim 6, wherein said computing member of said control means is operatively connected with said inlet chamber for control thereof.

9. An oven structure according to claim 6, wherein said transfer means is operatively connected with said computing member of said control means and is controlled thereby.

10. An oven structure according to claim 2, wherein said transferring means includes a notched rail system and conveyors adapted to ride on said rail system to place said conveyors into electrical contact with said cathodes when aligned therewith and to space said conveyors from said cathodes when they are not aligned therewith.

11. A furnace having a processing gas therein for thermochemical treatment of pieces of metals by ionic bombardment, said furnace comprising:
a furnace structure for heat treatment in a vacuum,
means for bringing the gas inside the furnace to a very low pressure,
at least one anode and several cathodes on which said pieces of metals to be treated inside the furnace can be disposed,
separate switching circuits connecting said anode and said cathodes in parallel to at least one high voltage source of supply, and
transfer means permitting the successive transfer of said pieces of metals on said cathodes in such a way that the heat treatment carried out on one piece is the sum of the partial treatments carried out on each of the cathodes, and that each of said partial treatments can vary from one piece to the other in order to obtain an appropriate treatment for each of the pieces.

12. The furnace according to claim 11, in which
said supply is provided to at least one of said anode-cathode pairs in such a way that the working point lies on the voltage-intensity curve, in a zone close to the zone of formation of an arc, and for the other anode-cathode pairs, the said supply is provided for the other of said anode-cathode pairs in such a way as to emit pulses of voltages, the total energy being calculated in such a way that at a predetermined energy regime it will not be possible to reach the arcing zone corresponding to the voltage-intensity discharge curve.

13. The furnace according to claim 12, wherein the cycle of said pulses relative to each of said cathodes is variable.

14. The furnace according to claim 13, in which
the pulses emitted on said cathodes are offset relative to one another.

15. The furnace according to claim 11, wherein
said furnace structure includes an entry lock, an exit lock, and means permitting the successive transfer of the pieces onto said cathodes, in a direction from said entry lock to said exit lock.

16. The furnace according to claim 15, wherein
said entry lock includes a structure for treatment in a vacuum comprising an anode and a cathode for producing an ionic bombardment.

17. The furnace according to claim 16, wherein
said entry lock is effective to carry out the preheating and a treatment of passivation by ionic bombardment under rarefied hydrogen atmosphere.

18. The furnace according to claim 17, including computer means for controlling said locks and transfer means.

19. The furnace according to claim 16, wherein
said exit lock comprises a cooling system.

20. The furnace according to claim 16, wherein
said exit lock comprises a quenching tank.

21. The furnace according to claim 11, including
computer means for controlling said switching circuits,
said computer means includes a memory for receiving data relating to the treatment time of each of the pieces of metal, and for individually controlling the treatment of each of the pieces of metals in the course of their progression inside the furnace.

22. The furnace according to claim 21, wherein
said computer means acts on said switching system to disconnect those of said cathodes on which the pieces of metals are disposed whose previously memorized treatment time has been exceeded regardless of the position of these pieces of metals inside the furnace, and also to disconnect those of said cathodes which are without pieces of metals thereon.

* * * * *